United States Patent [19]
Chen et al.

[11] Patent Number: 5,864,243
[45] Date of Patent: Jan. 26, 1999

[54] BUFFER AND METHOD FOR TRANSFERRING DATA THEREIN

[75] Inventors: Deng-Yuan David Chen; Waseem Ahmad, both of San Jose, Calif.

[73] Assignee: VLSI Technology, Inc., San Jose, Calif.

[21] Appl. No.: 715,457

[22] Filed: Sep. 18, 1996

[51] Int. Cl.[6] .................... H03K 19/00; H03K 19/0175
[52] U.S. Cl. ................... 326/58; 326/81; 326/83
[58] Field of Search .................. 326/80, 81, 83, 326/58, 57

[56] References Cited

U.S. PATENT DOCUMENTS

| | | | |
|---|---|---|---|
| 5,300,832 | 4/1994 | Rogers | 326/81 |
| 5,300,835 | 4/1994 | Assar et al. | |
| 5,381,062 | 1/1995 | Morris | 326/68 |
| 5,382,847 | 1/1995 | Yasuda | 326/58 |
| 5,410,267 | 4/1995 | Haycock et al. | 326/81 |
| 5,424,659 | 6/1995 | Stephens et al. | 326/81 |
| 5,434,519 | 7/1995 | Trinh et al. | 326/83 |
| 5,450,025 | 9/1995 | Shay | 326/81 |
| 5,451,889 | 9/1995 | Heim et al. | 326/81 |
| 5,477,172 | 12/1995 | Schnizlein | 327/99 |
| 5,481,471 | 1/1996 | Naglestad et al. | 364/489 |
| 5,534,789 | 7/1996 | Ting | 326/21 |
| 5,552,719 | 9/1996 | Murakami | 326/27 |
| 5,574,389 | 11/1996 | Chu | 326/81 |
| 5,604,457 | 2/1997 | Ting | 327/321 |
| 5,723,986 | 3/1998 | Nakashiro et al. | 326/81 |
| 5,748,011 | 5/1998 | Takahashi et al. | 326/81 |

OTHER PUBLICATIONS

Marcel J. M. Pelgrom and E. Carel Dijkmans, "A 3/5 V Compatible I/O Buffer", IEEE J. of Solid–State Circuits, vol. 30, No. 7, pp. 823–825, Jul. 1995.

John Williams, "Mixing 3–V and 5–V ICs", IEEE Spectrum, pp. 40–42, Mar. 1992.

Primary Examiner—Michael J. Tokar
Assistant Examiner—Richard Roseen
Attorney, Agent, or Firm—Wells, St. John, Roberts, Gregory & Matkins P.S.

[57] ABSTRACT

A mixed voltage compatible buffer having reduced power consumption is provided. One embodiment of the buffer according to the present invention comprises: a data input configured to receive an output data signal; a data interface configured to couple with a pad interconnect; an output driver coupled with said data interface and being configured to apply the output data signal thereto; and a data controller intermediate said data input and said output driver, said data controller being configured to apply a plurality of control signals of substantially equal voltage to said output driver to control the operation thereof responsive to the output data signal received via said data input. The present invention also provides for a method of transferring data within the buffer.

41 Claims, 6 Drawing Sheets

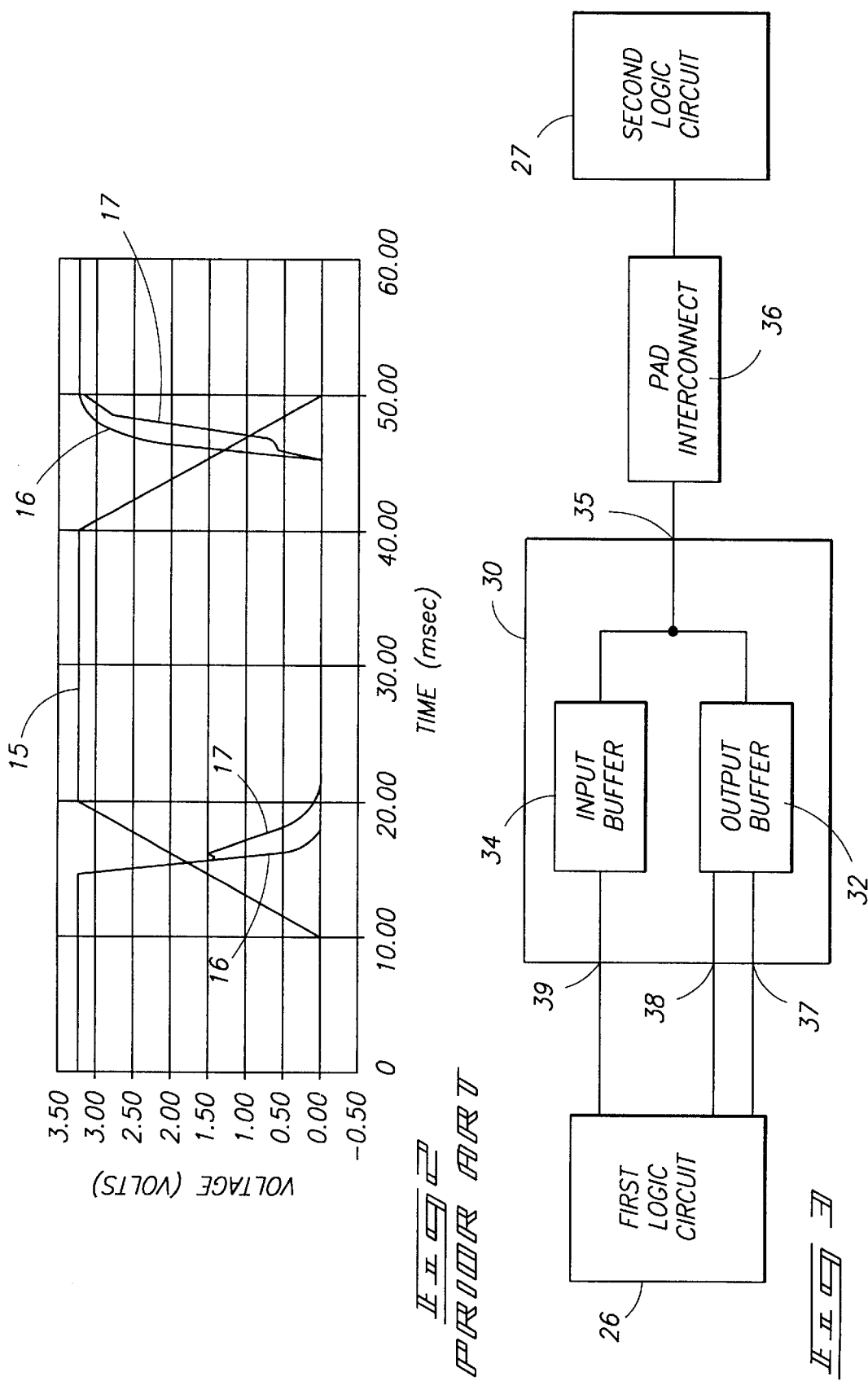

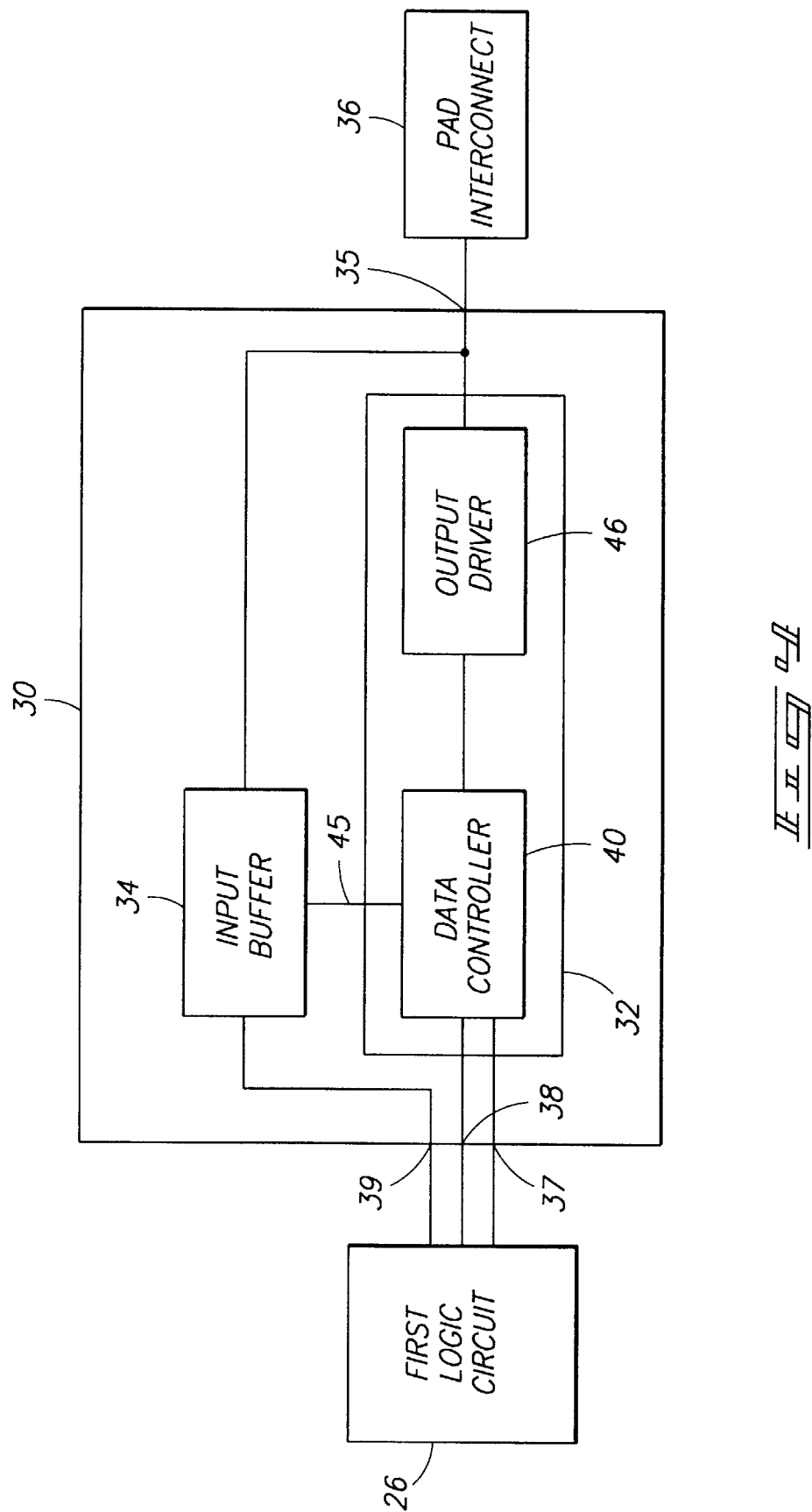

BUFFER AND METHOD FOR TRANSFERRING DATA THEREIN

TECHNICAL FIELD

The present invention relates to buffers and methods for transferring data therein.

BACKGROUND OF THE INVENTION

Portable personal computers have generated a large demand for low power integrated circuits. The utilization of low power integrated circuits (i.e., 3.3 volts) within portable systems, such as a laptop personal computer, provides reduced consumption and longer battery life. However, some 5 volt integrated circuits provide performance advantages over low power 3.3 volt integrated circuits. Therefore, both 5 volt integrated circuits and 3.3 volt integrated circuits may be utilized within a single personal computer.

An input/output buffer may be utilized intermediate mixed voltage logic circuits. Several problems may arise when 3.3 volt and 5 volt integrated circuits are intermixed within a single device. For example, 3.3 volt integrated circuits usually have a thin MOS gate oxide compared with the 5 volt integrated circuit (70A versus 90A). The MOS gate oxide of 3.3 volt circuits may become leaky when a 5 volt input signal is applied to it. The MOS gate oxide may become leaky due to tunneling effect or time-dependent dielectric breakdown (TDDB) effect. The gate oxide might also be permanently damaged if the electric field in the oxide is larger than its breakdown voltage.

Another problem is leakage current from a 5 volt pad interconnect to the input/output buffer power supply via a parasitic junction diode of the PMOS transistor. A third problem is the leakage current caused by higher static current due to 5 volts on the respective drains of the 3.3 volt powered PMOS and NMOS. A final problem is the leakage current from the electrostatic discharge (ESD) protection diode on the driven input buffer. Other reliability issues which may arise with the mixing of 3.3 volt and 5 volt integrated circuits include hot carrier effect and electromigration due to the higher pad voltage (i.e. 5 volts) on the respective drains of the output metal-oxide semiconductor transistors.

A cascade output NMOS transistor may be utilized to protect an NMOS output transistor of the input/output buffer to eliminate or minimize many of the aforementioned design problems.

Referring to FIG. 1, a prior art input/output buffer 10 having an NMOS output transistor 11 and a PMOS output transistor 13 is shown coupled with a pad 14. The NMOS output transistor 11 is coupled with a cascade NMOS output transistor 12. The channel width and length (W/L) ratio within each of the cascaded NMOS output transistors 11, 12 is doubled (compared to the width and length ratio of a single output NMOS transistor) to maintain the original driving strength.

The prior art I/O buffer 10 shown in FIG. 1 minimizes some of the design problems and tolerates a 5 volt input data signal on the pad 14. However, the prior art I/O buffer 10 is not a true CMOS buffer inasmuch as its output PMOS transistor 13 and output NMOS transistor 11 are not fully turned off when the output data signal is changed from low to high and high to low, respectively.

The graph shown in FIG. 2 illustrates that the voltages on the gates of the output NMOS transistor 11 and the output PMOS transistor 13 (represented by respective lines 16 and 17 in FIG. 2) are not equal from before and after switching in response to changes of an output data signal (represented by line 15).

The utilization of the drain voltage from the output NMOS transistor 11 to control the gate voltage of the output PMOS transistor 13 results in the inequality of the gate voltages of the output NMOS transistor 11 and the output PMOS transistor 13. This inequality during switching is shown in FIG. 2 and draws unnecessary current which increases power consumption.

Therefore, there exists an increased need for a buffer which operates as a true CMOS buffer within a mixed voltage signaling environment.

BRIEF DESCRIPTION OF THE DRAWINGS

Preferred embodiments of the invention are described below with reference to the following accompanying drawings.

FIG. 2 is a graphical representation of the gate voltages applied to the transistors within the output driver of the prior art buffer shown in FIG. 1.

FIG. 3 is a functional block diagram of a buffer according to the present invention interposed between a first logic circuit and a second logic circuit.

FIG. 4 is a functional block diagram, similar to FIG. 3, of a buffer according to the present invention.

DETAILED DESCRIPTION OF THE PREFERRED EMBODIMENTS

Figure 1:
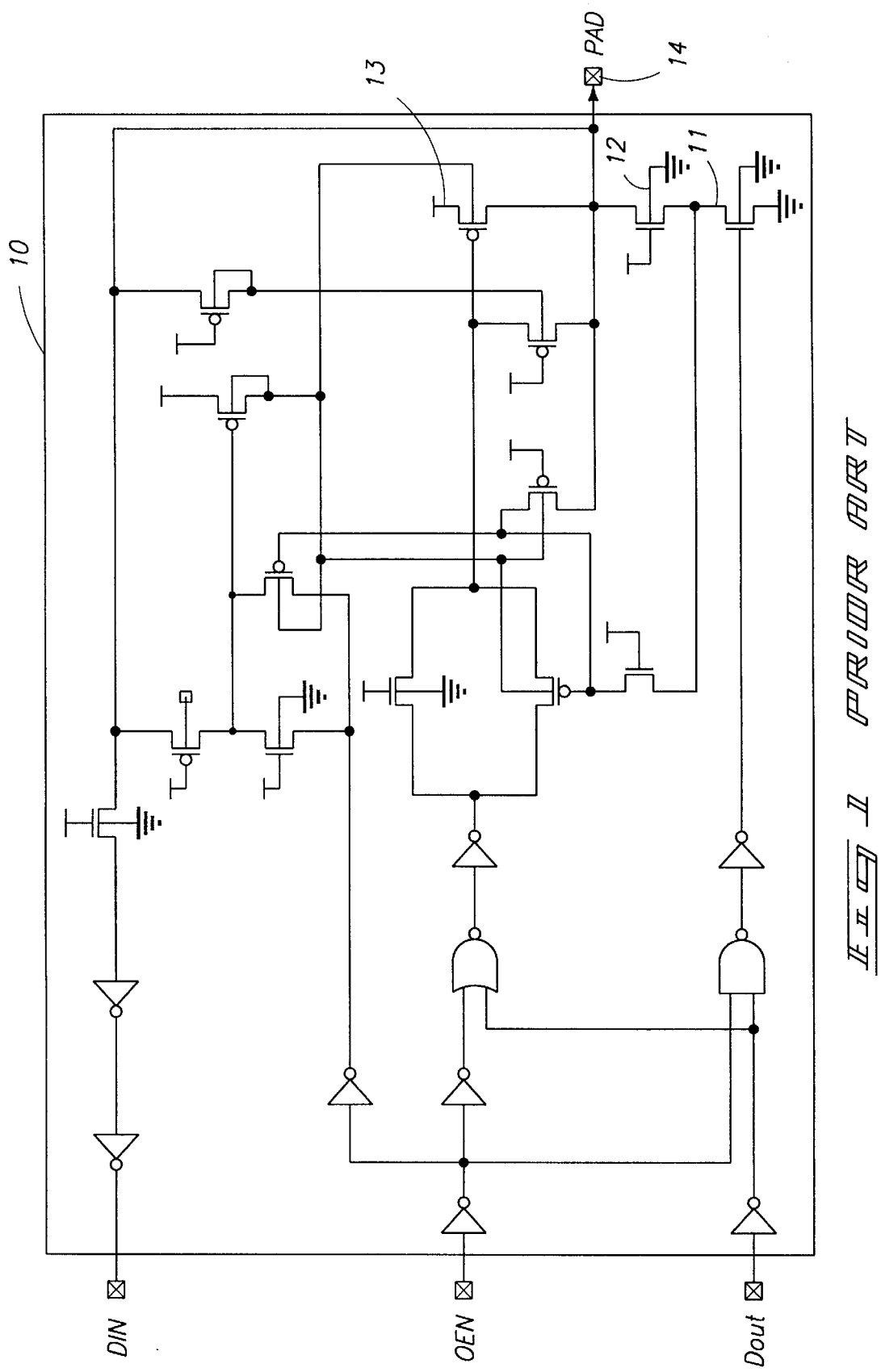
FIG. 1 is a schematic diagram of a prior art 3 volt/5 volt compatible input/output buffer.

This disclosure of the invention is submitted in furtherance of the constitutional purposes of the U.S. Patent Laws "to promote the progress of science and useful arts" (Article 1, Section 8).

Although the present invention is generally described herein as a Peripheral Component Interconnect Input/Output Buffer, it is to be distinctly understood that the buffer according to the present invention may be utilized for interfacing between general mixed 3.3 volt and 5 volt logic circuits.

In accordance with one aspect of the invention, a buffer comprises:
  a data input configured to receive an output data signal;
  a data interface configured to couple with a pad interconnect;
  an output driver coupled with said data interface and being configured to apply the output data signal thereto; and
  a data controller intermediate said data input and said output driver, said data controller being configured to apply a plurality of control signals of substantially equal voltage to said output driver to control the operation thereof responsive to the output data signal received via said data input.

In accordance with another aspect of the present invention, the buffer comprises:

a data input configured to receive an output data signal;

a data controller coupled with said data input;

a data interface configured to couple with a pad interconnect;

an output driver including a first output transistor and a second output transistor individually coupled with said data controller; and said data controller applying a first control signal to said first output transistor and a second control signal to said second output transistor, said first control signal and said second control signal having substantially equal voltages, said first output transistor and said second output transistor being operable to apply the output data signal to said data interface.

In accordance with still another aspect of the present invention, a method of transferring data within a buffer comprises:

providing a first output transistor and a second output transistor for controlling the application of an output data signal to a data interface;

applying a first control signal to said first output transistor responsive to the output data signal; and applying a second control signal to said second output transistor responsive to the output data signal, the voltage of said first control signal and the voltage of said second control signal being substantially equal.

Bidirectional Buffer Overview

Referring to FIG. 3, a bidirectional buffer 30 is shown intermediate a 3.3 volt or first logic circuit 26 and a 5 volt or second logic circuit 27. The bidirectional buffer 30 generally comprises an output buffer 32 and an input buffer 34 each coupled with the first logic circuit 26 and the second logic circuit 27. A pad interconnect 36 is intermediate the bidirectional buffer 30 and the second logic circuit 27.

The preferred bidirectional buffer 30 according to the present invention is powered by a 3.3 volt power supply. The 3.3 volt power supply is represented as Vdd in FIG. 5 and FIG. 6. The preferred bidirectional buffer 30 may be utilized in a mixed 3.3 volt–5 volt signaling environment and is capable of 5 volt tolerance when it operates in an input mode. Additionally, the preferred bidirectional buffer 30 may operate as a true output CMOS buffer which can drive 3.3 volt and 5 volt signaling circuits on the same Peripheral Component Interconnect (PCI) bus.

The bidirectional buffer 30 includes an output enable interface 37, a data input 38 and a data output 39 coupled with the first logic circuit 26. The bidirectional buffer 30 in accordance with the present invention additionally includes a data interface 35 which is coupled with the pad interconnect 36. The data interface 35 is configured to transfer input data signals and output data signals.

An output enable signal (also referred to as an OEN signal) is generated within the first logic circuit 26 and is applied to the OEN interface 37 within the bidirectional buffer 30. The OEN signal controls the operation of the bidirectional buffer 30 between an input mode and an output mode. Output data signals may be transferred from the first logic circuit 26 to the second logic circuit 27 when the bidirectional buffer 30 operates in the output mode. Input data signals may be transferred from the second logic circuit 27 to the first logic circuit 26 when the bidirectional buffer 30 operates in an input mode.

The bidirectional buffer 30 operates in an output mode responsive to the OEN signal being a logic low signal. When operating in an output mode, a 3.3 volt output data signal generated within the first logic circuit 26 may enter the buffer 32 via the data input 38. The output data signal passes into the output buffer 32 of the bidirectional buffer 30. The output buffer 32 applies the output data signal through the data interface 35 to the pad interconnect 36 which is coupled with the second logic circuit 27. The bidirectional buffer 30 may drive either a 3.3 volt or 5 volt circuit via the pad interconnect 36.

The output buffer 32 of the bidirectional buffer 30 operates as a true CMOS output buffer. Referring to FIG. 4, the output buffer 32 includes an output driver 46 for driving the second logic circuit 27 and a data controller 40 for operating the output driver 46 in response to the input data signal.

Figure 5:
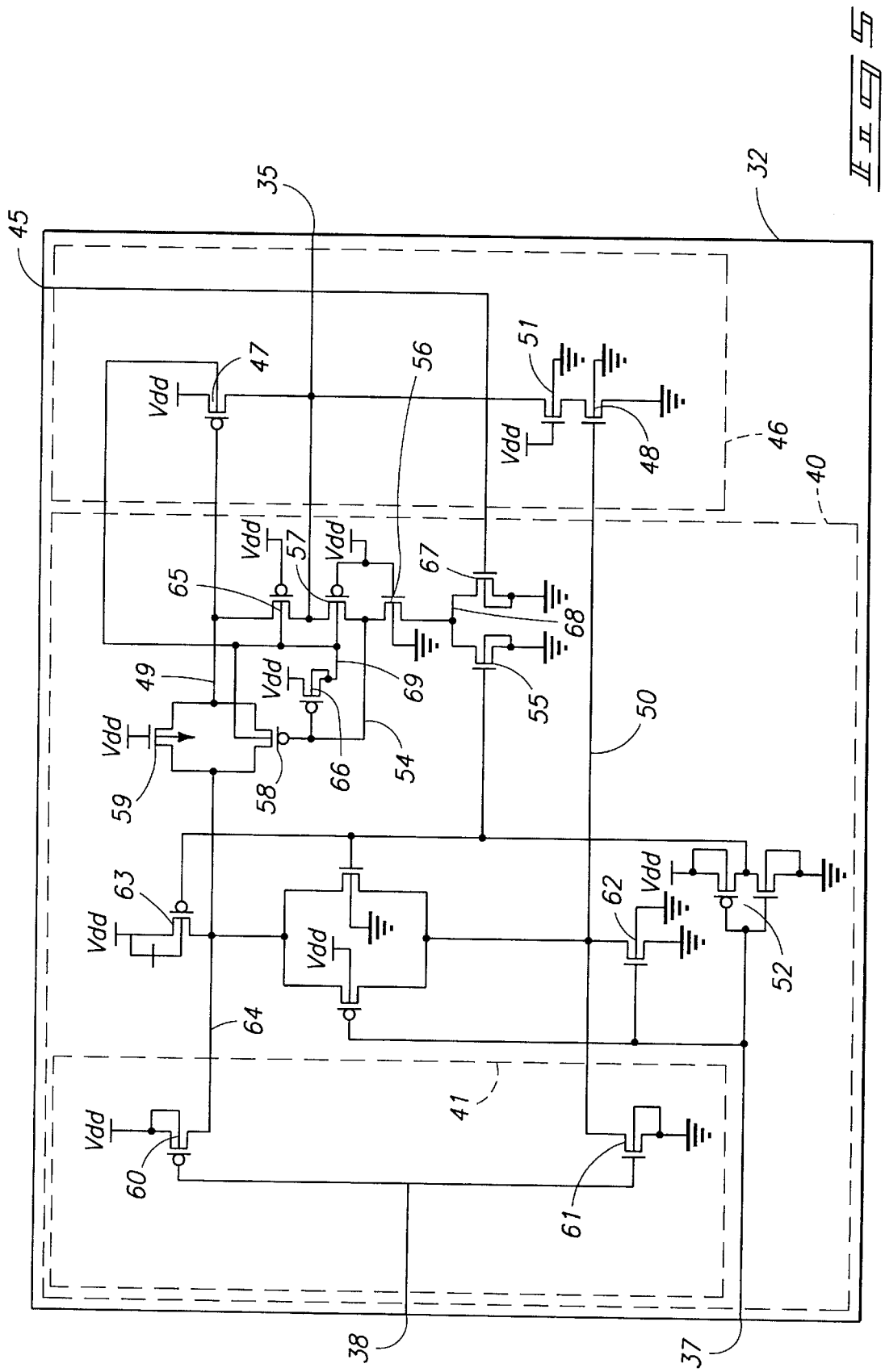
FIG. 5 is a schematic diagram of a preferred embodiment of an output buffer in accordance with the present invention.

The output buffer 32 is shown in detail in FIG. 5. The output driver 46 comprises a first output transistor 47 and second output transistor 48. The first output transistor 47 is a PMOS transistor and the second output transistor 48 is a NMOS transistor. A cascade NMOS transistor 51 is interposed between the second output transistor 48 and the data interface 35. The cascade NMOS transistor 51 is utilized to protect the second output transistor 48 in the presence of an input data signal having a voltage which exceeds a predetermined threshold (e.g., 3.3 volts).

The data controller 40 is coupled with the first output transistor 46 and the second output transistor 47 via a respective first interconnect 49 and second interconnect 50. The data controller 40 provides first and second control signals to the output driver 46 to control the generation of the output data signal applied to the second logic circuit 27. The data controller 40 generates the first and second control signals in response to the output data signal received via the data input 38.

Figure 7:
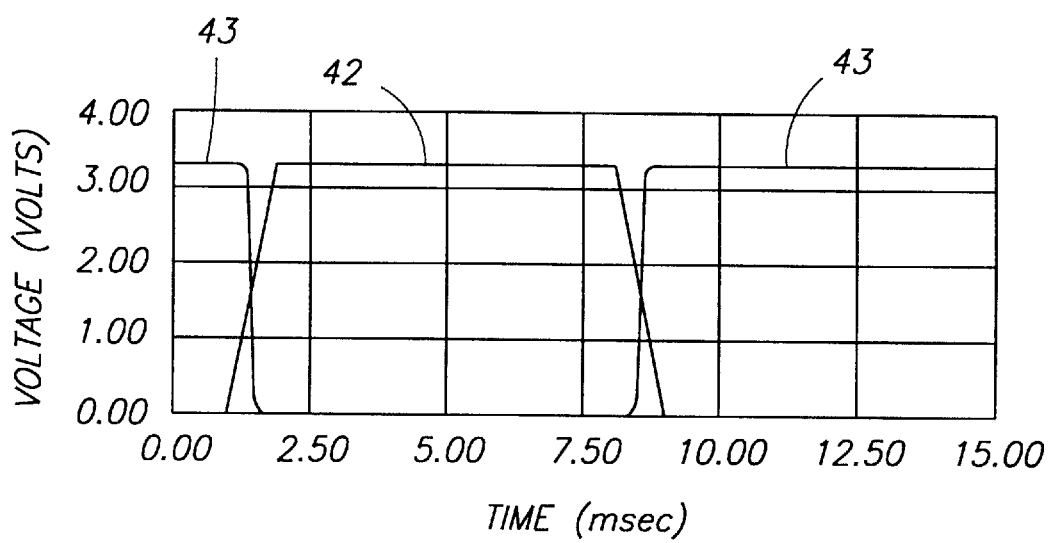
FIG. 7 is a graphical representation of the gate voltages applied to the transistors within the output driver of a buffer according to the present invention.

The first and second control signals are applied to the respective gate electrodes of the first output transistor 47 and the second output transistor 48. The voltages of the two control signals are substantially equal at any given time. In particular, the voltages of the two control signals are substantially equal as shown in FIG. 7 during switching between logic high and logic low in response to a change in state of the output data signal. Therefore, the output driver 46 only draws current during switching, thereby reducing current leakage and power consumption.

The bidirectional buffer 30 operates in an input mode when the OEN signal is logic high. As shown in FIG. 3, an input data signal generated within the second logic circuit 27 is applied via the pad interconnect 36 to the data interface 35 of the bidirectional buffer 30. The voltage of the input data signal may be between 0 and 5 volts. The input data signal passes through the input buffer 34 to the first logic circuit 26 via the data output 39. The output driver 46 is in an OFF state responsive to the presence of a logic high OEN signal from the first logic circuit 26.

The bidirectional buffer 30, in an input mode, may operate in a 3.3 volt to 5 volt signalling environment. More specifically, the bidirectional buffer 30 may tolerate a 5 volt input data signal received via the pad interconnect 36 without incurring excessive leakage current or a gate reliability problem.

Output Buffer Operation

The operation of the output buffer 32 in accordance with the present invention is discussed with reference to FIG. 4 and FIG. 5. The first logic circuit 26 generates a logic low output enable signal when data will be outputted to the second logic circuit 27 via the bidirectional buffer 30.

The logic low OEN signal is received by the OEN interface 37 and subsequently applied to a CMOS inverter 52 as shown in FIG. 5. The CMOS inverter 52 outputs a logic high signal (3.3 volts). A plurality of transistors, including a first NMOS transistor 55, a second NMOS transistor 56, and a first PMOS transistor 57 control the voltage at a fourth interconnect 54 responsive to the OEN signal. The transistors 55, 56, 57 are configured such that the fourth interconnect 54 is 0 volts whenever the OEN signal is logic low. The inverted OEN signal from the CMOS inverter 52 is applied to the gate electrode of the first NMOS transistor 55. The inverted OEN signal biases the first NMOS transistor 55 in an ON state thereby coupling the fourth interconnect 54 with ground via the second NMOS transistor 56.

A first isolating transistor 58 and a second isolating transistor 59 are provided within the data controller 40. The first isolating transistor 58 and second isolating transistor 59 are intermediate the data input 38 and the first output transistor 47. The first isolating transistor 58 is fully open when the fourth interconnect 54 is 0 volts. The second isolating transistor 59 is fully open and provides a connection path in parallel with the first isolating transistor 59. Both isolating transistors 58, 59 are operable to pass a control signal to the first output transistor 47 via the first interconnect 49.

The data controller 40 includes a predriver 41. The predriver 41 generates control signals for operating the output transistors 47, 48 in response to the output data signal. The output data signal is received into the bidirectional buffer 30 via the data input 38. The data input 38 is coupled with the predriver 41 as shown in FIG. 5.

The predriver 41 includes a first predriver transistor 60 which is a PMOS transistor and a second predriver transistor 61 which is a NMOS transistor. The predriver transistors 60, 61 are coupled with respective ones of the output transistors 47, 48 via the interconnects 49, 50. The isolating transistors 58, 59 are intermediate the first predriver transistor 60 and the first interconnect 49. The isolating transistors 58, 59 operate to pass one control signal to the first interconnect 49 in response to the OEN signal being a logic low.

The bidirectional buffer 30 according to the present invention operates as a CMOS buffer in the output mode. In particular, the voltages of the control signals applied to the respective gate electrodes of each of the first output transistor 47 and second output transistor 48 are substantially equal.

As shown in the graph of FIG. 7, the bidirectional buffer 30 functions as a true CMOS buffer in the output mode of operation. The gate voltage of the first output transistor 47 and the gate voltage of the second output transistor 48 (both represented by line 43) are substantially equal during a change of the output data signal (represented by line 42) from logic high to logic low and logic low to logic high. The bidirectional buffer 30 operating in an output mode only draws current during switching and does not consume additional power.

Input Buffer Operation

Figure 6:
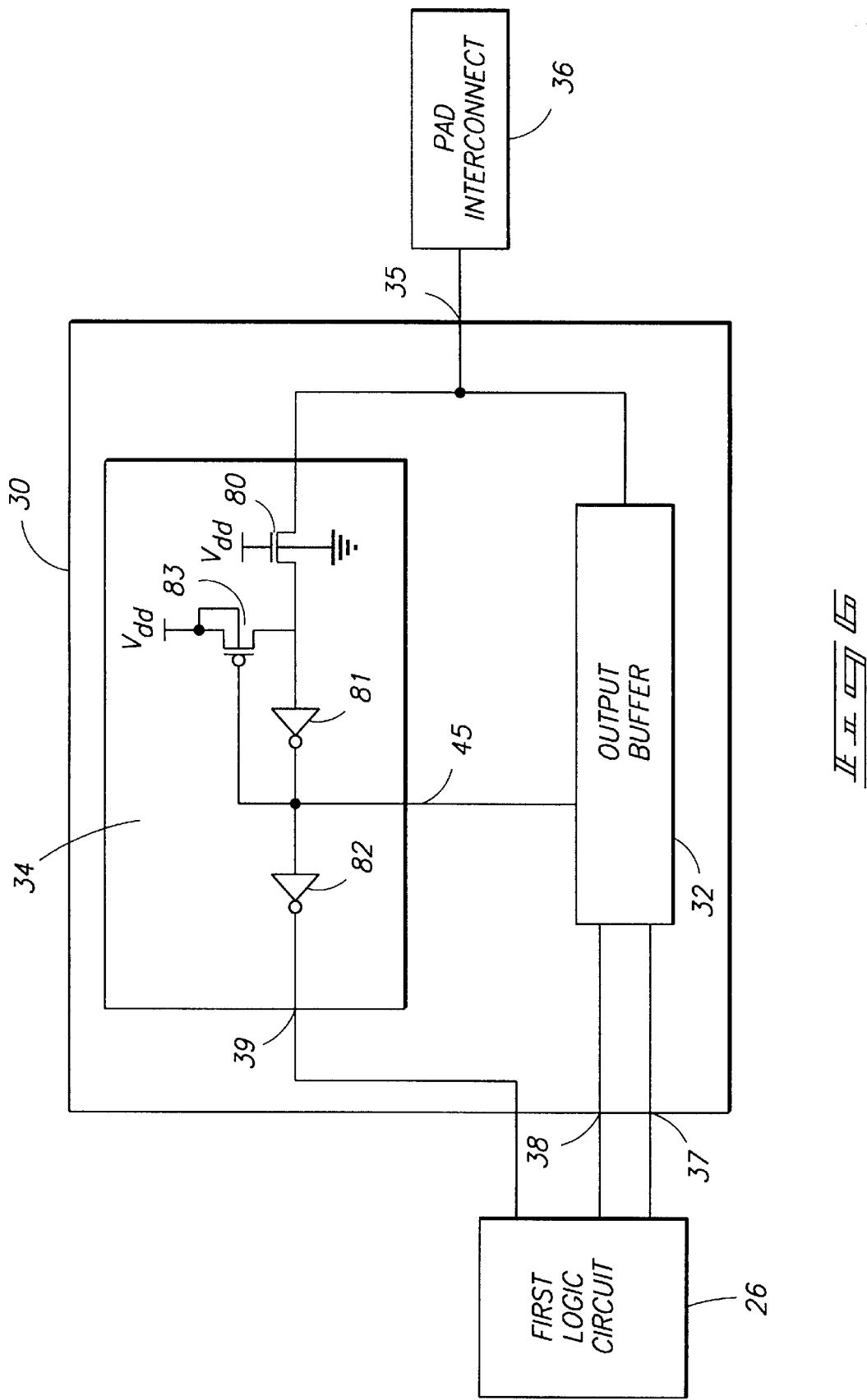
FIG. 6 is a schematic diagram of a bidirectional buffer showing a preferred embodiment of an input buffer in accordance with the present invention.

Referring to FIG. 6, the bidirectional buffer 30 operates in an input mode when the OEN signal is a logic high, 3.3 volt signal. The bidirectional buffer 30 receives an input data signal from the second logic circuit 27. The input data signal is typically 0 volts corresponding to a logic low signal, and 3.3 volts or 5 volts corresponding to a logic high signal.

The input buffer 34 comprises a first input transistor 80, a first input inverter 81, a second input inverter 82 and a second input transistor 83. The input data signal received by the data interface 35 is applied to the first input transistor 80. The first input transistor 80 operates as a cascade to protect the first input inverter 81 from a 5 volt input data signal. The first input transistor 80 applies the input data signal to the first input inverter 81. The input data signal is thereafter applied to the second inverter 82 and subsequently to the data output 39.

The second input transistor 83 operates to maintain the voltage at the node at the output of the first input transistor 80 at a predetermined voltage (e.g., 3.3 volts) responsive to the input data signal being between 3.3 volts and 5 volts (input data signal is logic high). Maintaining a 3.3 volt signal at the output node of the first input transistor 80 prevents leakage current through the first input inverter 81.

Referring to FIG. 5, the data controller 40 provides protection of the first output transistor 47 and reduces leakage current therethrough in the presence of a 5 volt input data signal. In particular, the respective n-wells of the first output transistor 47, first PMOS transistor 57, first isolating transistor 58, third PMOS transistor 65 and fourth PMOS transistor 66 are coupled at a common interconnect 69. Providing floating n-wells for the PMOS transistors 47, 57, 58, 65 and 66 avoids an overvoltage condition and leakage current through the respective transistors when 5 volts is present at the data interface 35. Further, the n-well of the first output transistor 47 is isolated from the Vdd power bus coupled with the source power electrode of the first output transistor 47 as shown in FIG. 5.

Further, each PMOS transistor 47, 57, 58, 65 and 66 having at least one power terminal at 5 volts does not have a gate oxide reliability issue because the relative bias between the terminals is below 3.3 volts. No current from the 5 volt input data signal received at the data interface 35 is applied to the 3.3 volt power supply via the first output transistor 47 because the common interconnect 69 is charged to 5 volts—Vpn (where Vpn is the build-in potential of the parasitic PN junction diode).

It is desired to turn off the first and second output transistors 47,48 in response to the operation of the bidirectional buffer 30 in an input mode. The data controller 40 is configured to maintain the output transistors 48 in an OFF state responsive to a logic high OEN signal. The data controller 40 maintains the output transistors 47, 48 in an OFF state independent of the voltage of the input data signal received at data interface 35.

Referring again to FIG. 5, the data controller 40 maintains the second output transistor 48 in an OFF state responsive to the OEN signal being logic high. More specifically, the data controller 40 includes a third NMOS transistor 62 which is controlled by the OEN signal and selectively couples the second interconnect 50 with ground. Providing a 3.3 volt OEN signal to the OEN interface 37 turns on the third NMOS transistor 62. Turning the third NMOS transistor 62 on results in the application of a 0 volt control signal via the second interconnect 50 to the gate electrode of the second output transistor 48. Applying the logic low control signal via the second interconnect 50 turns off the second output transistor 48. The second output transistor 48 is off when the OEN signal is logic high.

The data controller 40 also operates to maintain the first output transistor 47 in an OFF state. The data controller 40 includes a third PMOS transistor 65, fourth PMOS transistor 66 and fourth NMOS transistor 67. Responsive to a 5 volt input data signal present at the data interface 35, the first PMOS transistor 57 and the third PMOS transistor 65 turn on thereby applying 5 volts to the first interconnect 49 and the fourth interconnect 54. Applying 5 volts to the first interconnect 49 maintains the first output transistor 47 of the output driver 46 in an OFF state.

The data controller 40 additionally operates to maintain the first output transistor 47 in an OFF state responsive to the input data signal being less than 5 volts and the bidirectional buffer 30 operating in an input mode.

In particular, the data controller 40 includes a second PMOS transistor 63, which is controlled by the OEN signal, and a third interconnect 64 which couples the first predriver transistor 60 with isolating transistors 58, 59. The presence of a 3.3 volt OEN signal results in the inverter 52 generating a logic low signal which is applied to the control electrode of the second PMOS transistor 63. The second PMOS transistor 63 thereafter operates to apply 3.3 volts to the third interconnect 64.

The 3.3 volt signal is utilized to maintain the first output transistor 47 in an OFF state responsive to the input data signal being 0 or 3.3 volts. In particular, the 3.3 volt signal is applied to the third interconnect 64 responsive to the OEN signal being logic high. The first isolating transistor 58 and second isolating transistor 59 operate in an ON state responsive to the input data signal being 3.3 volts. The first and second isolating transistors 58, 59 operate to pass 3.3 volts to the first interconnect 49. Therefore, the first output transistor 47 is maintained in an OFF state when a 3.3 volt input data signal is received at the data interface 35. The voltage at the common interconnect 69 is 3.3 volts in this situation providing latch-up immunity.

The first output transistor 47 is also maintained in an OFF state in response to the input data signal being logic low (0 volts). In particular, the output of the first input inverter 81 is 3.3 volts. A sixth interconnect 45 couples the output of the first input inverter 81 with the gate electrode of the fourth NMOS transistor 67. The fourth NMOS transistor 67 is turned on responsive to the application of 3.3 volts to the gate electrode thereof and the fifth interconnect 68 is connected to ground. The fourth NMOS transistor 67 is utilized to make sure the fourth interconnect 54 is 0 volts when the input data signal is logic low to maintain the first output transistor 47 in an OFF state.

The second NMOS transistor 56 and first PMOS transistor 57 form a CMOS inverter and the fourth interconnect 54 is therefore 0 volts. The logic low signal present on the fourth interconnect 54 is applied to the control electrode of the first isolating transistor 58. The first isolating transistor 58 is in an ON state thereby ensuring that the 3.3 volt signal present at the third interconnect 64, and supplied via the second PMOS transistor 63, is thereafter applied to the first interconnect 49. The first interconnect 49 is 3.3 volts and the first output transistor 47 is maintained in an OFF state thereby preventing leakage current through the first output transistor 47 when the input data signal is 0 volts.

The first output transistor 47 and second output transistor 48 are maintained in an OFF state during operation of the bidirectional buffer 30 in an input mode. Therefore, no current may leak through the output transistors 47, 48 despite changes in voltage of the input data signal. The bidirectional buffer 30 in accordance with the present invention provides improved power performance over the conventional buffers.

The data controller 40 additionally provides protection of the predriver 41 components during the reception of an input data signal via the data interface 35 which has a voltage (e.g., 5 volts) in excess a predetermined threshold (e.g., 3.3 volts).

The data controller 40 includes isolating transistors 58, 59 which are utilized to protect the predriver 41 during the reception of a 5 volt input data signal. In particular, the second isolating transistor 59 operates as a cascade to protect the predriver 41. Further, the presence of a 5 volt signal on the fourth interconnect 54 turns the first isolating transistor 58 off. Providing the first isolating transistor 58 in an OFF state prevents a 5 volt signal from passing therethrough and damaging the components of the predriver 41.

Electrostatic discharge (ESD) and latch-up should be considered during the design of the bidirectional buffer 30. The PMOS transistors 57, 58, 65, 66 within the data controller 40 should be positioned inside the same guarding and dummy collector ring as the first output transistor 47 because the PMOS transistors share the same floating n-well.

Noise (e.g., simultaneous switching noise, ground bounce) is another concern for the design of the bidirectional buffer 30. The power and ground are usually separated into quite and noisy lines to avoid or minimize the noise.

In compliance with the statute, the present invention has been described in language more or less specific as to structural and methodical features. It is to be understood, however, that the present invention is not limited to the specific features shown and described, since the means herein disclosed comprise preferred forms of putting the invention into effect. The present invention is, therefore, claimed in any of its forms or modifications within the proper scope of the appended claims appropriately interpreted in accordance with the doctrine of equivalents.

We claim:

1. A buffer, comprising:
   a data input configured to receive an output data signal;
   a data interface configured to couple with a pad interconnect;
   an output driver coupled with said data interface and being configured to apply the output data signal thereto; and
   a data controller intermediate said data input and said output driver, said data controller being configured to apply a plurality of control signals having substantially equal voltages during a change in voltage of the control signals, said data controller being configured to apply the control signals to said output driver to control the operation thereof responsive to the output data signal received via said data input.

2. The buffer according to claim 1 wherein said data controller selectively maintains said output driver in an OFF state responsive to an output enable signal.

3. The buffer according to claim 1 wherein said data controller selectively maintains said output driver in an OFF state such that no current is passed to said data interface.

4. The buffer according to claim 1 further comprising an output enable interface coupled with said data controller, and said output enable interface being configured to receive an output enable signal which controls the operation of said buffer in an input mode and output mode.

5. The buffer according to claim 1 wherein said data controller includes a predriver configured to receive the output data signal from said data input and generate said control signals in response thereto.

6. The buffer according to claim 5 wherein said data controller selectively isolates said predriver from said data interface.

7. The buffer according to claim 5 wherein said data controller selectively isolates said predriver from said data interface responsive to said data interface receiving an input data signal having a voltage in excess of a threshold.

8. The buffer according to claim 1 further comprising:
   a data output configured to receive an input data signal;
   a first input transistor coupled with said data interface;
   a first inverter intermediate said first input transistor and said data output; and
   a second input transistor operable to maintain a predetermined voltage at a node joining said first input transistor and said first inverter.

9. The buffer according to claim 1 further comprising a data output coupled with said data interface, and said data output being configured to receive an input data signal therefrom.

10. The buffer according to claim 9 wherein said data controller selectively maintains said output driver in an OFF state responsive to an output enable signal.

11. The buffer according to claim 9 wherein said data controller selectively maintains said output driver in an OFF state such that no current is passed to said data interface.

12. The buffer according to claim 9 further comprising an output enable interface coupled with said data controller, and said output enable interface being configured to receive an output enable signal which controls the operation of said buffer in an input mode and output mode.

13. The buffer according to claim 9 wherein said data controller includes a predriver configured to receive the output data signal from said data input and generate said control signals in response thereto.

14. The buffer according to claim 13 wherein said data controller selectively isolates said predriver from said data interface.

15. The buffer according to claim 13 wherein said data controller selectively isolates said predriver from said data interface responsive to said data interface receiving an input data signal having a voltage in excess of a threshold.

16. A buffer, comprising:
   a data input configured to receive an output data signal;
   a data controller coupled with said data input;
   a data interface configured to couple with a pad interconnect;
   an output driver including a first output transistor and a second output transistor individually coupled with said data controller; and
   said data controller applying a first control signal to said first output transistor and a second control signal to said second output transistor, said first control signal and said second control signal having substantially equal voltages during a change in voltage of said first control signal and said second control signal, said first output transistor and said second output transistor being operable to apply the output data signal to said data interface.

17. The buffer according to claim 16 wherein said output transistors are metal-oxide semiconductor transistors, and said first output transistor includes a n-well and a power electrode configured to couple with a power bus, and said n-well is isolated from said power bus.

18. The buffer according to claim 16 wherein said data controller selectively maintains said first output transistor and said second output transistor in an OFF state.

19. The buffer according to claim 16 wherein said data controller selectively maintains said first output transistor and said second output transistor in an OFF state such that no current is passed to said data interface.

20. The buffer according to claim 16 further comprising an output enable interface coupled with said data controller, and said output enable interface being configured to receive an output enable signal to control the operation of said buffer in an input mode and output mode.

21. The buffer according to claim 16 wherein said data controller includes a predriver configured to receive the output data signal from said data input and generate said first control signal and said second control signal in response thereto.

22. The buffer according to claim 21 wherein said data controller selectively isolates said predriver from said data interface.

23. The buffer according to claim 21 wherein said data controller isolates said predriver from said data interface responsive to said data interface receiving an input data signal having a voltage in excess of a threshold.

24. The buffer according to claim 16 further comprising:
   a data output configured to receive an input data signal;
   a first input transistor coupled with said data interface;
   a first inverter intermediate said first input transistor and said data output; and
   a second input transistor operable to maintain a voltage at a node joining said first input transistor and said first inverter.

25. The buffer according to claim 16 further comprising a data output coupled with said data interface and said data output being configured to receive an input data signal therefrom.

26. The buffer according to claim 25 wherein said first output transistor and said second output transistor are metal-oxide semiconductor transistors, and said first output transistor includes a n-well and a power electrode configured to couple with a power bus, and said n-well is isolated from said power bus.

27. The buffer according to claim 25 wherein said data controller selectively maintains said first output transistor and said second output transistor in an OFF state responsive to an output enable signal.

28. The buffer according to claim 25 wherein said data controller selectively maintains said first output transistor and said second output transistor in an OFF state such that no current is passed to said data interface.

29. The buffer according to claim 25 further comprising an output enable interface coupled with said data controller, and said output enable interface being configured to receive an output enable signal to control the operation of said buffer in an input mode and an output mode.

30. The buffer according to claim 25 wherein said data controller includes a predriver configured to receive the output data signal from said data input and generate said control signals in response thereto.

31. The buffer according to claim 30 wherein said data controller selectively isolates said predriver from said data interface.

32. The buffer according to claim 30 wherein said data controller isolates said predriver from said data interface responsive to said data interface receiving an input data signal having a voltage in excess of a threshold.

33. A bidirectional buffer, comprising:
   a data input configured to receive an output data signal;
   a data controller coupled with said data input;
   a data interface configured to couple with a pad interconnect;
   a data output coupled with said data interface, and said data output being configured to receive an input data signal therefrom;

an output driver including a first output metal-oxide semiconductor transistor and a second output metal-oxide semiconductor transistor individually coupled with said data controller;

said data controller including a predriver operable to apply a first control signal to said first output metal-oxide semiconductor transistor and a second control signal to said second output metal-oxide semiconductor transistor, said first control signal and said second control signal having substantially equal voltages during a change in voltage of said first control signal and said second control signal, said data controller being operable to selectively isolate said predriver from said data interface; and said first output metal-oxide semiconductor transistor and said second output metal-oxide semiconductor transistor being operable to apply the output data signal to said data interface.

34. A method of transferring data within a buffer, comprising:

receiving an output data signal;

providing a first output transistor and a second output transistor for controlling the application of the output data signal to a data interface;

applying a first control signal to said first output transistor responsive to the output data signal; and applying a second control signal to said second output transistor responsive to the output data signal, the voltage of said first control signal and the voltage of said second control signal being substantially equal during a change in voltage of said first control signal and said second control signal.

35. The method according to claim 34 further comprising the step of isolating an n-well of said first output transistor from a bus supplying voltage to a power terminal thereof.

36. The method according to claim 34 further comprising the step of selectively maintaining said first output transistor and said second output transistor in an OFF state responsive to an output enable signal.

37. The method according to claim 34 wherein a predriver generates said first control signal and said second control signal.

38. The method according to claim 37 further comprising the step of selectively isolating said first output transistor from a predriver.

39. The method according to claim 34 further comprising the step of receiving an input data signal.

40. The method according to claim 34 further comprising the steps of:

receiving an input data signal; and maintaining said first output transistor and said second output transistor in an OFF state during said receiving said input data signal.

41. The method according to claim 34 further comprising the steps of:

receiving an input data signal;

maintaining said first output transistor and said second output transistor in an OFF state during said receiving said input data signal;

isolating said first output transistor from a predriver; and isolating an n-well of said first output transistor from a bus supplying voltage to a power terminal thereof.

* * * * *